(12) United States Patent  
Isobe

(10) Patent No.: US 7,223,682 B2  
(45) Date of Patent: May 29, 2007

(54) METHOD OF MAKING A SEMICONDUCTOR DEVICE USING BUMP MATERIAL INCLUDING A LIQUID

(75) Inventor: Shinobu Isobe, Tateyama (JP)

(73) Assignee: UMC Japan, Tateyama (JP)

( * ) Notice: Subject to any disclaimer, the term of this patent is extended or adjusted under 35 U.S.C. 154(b) by 127 days.

(21) Appl. No.: 11/011,270

(22) Filed: Dec. 13, 2004

(65) Prior Publication Data

US 2005/0239276 A1 Oct. 27, 2005

(30) Foreign Application Priority Data

Apr. 22, 2004 (JP) .......................... P2004-126872

(51) Int. Cl.  
*H01L 21/44* (2006.01)

(52) U.S. Cl. ............... 438/612; 438/613; 438/E23.021; 257/737

(58) Field of Classification Search ........ 438/111–116, 438/612–616; 257/737–738  
See application file for complete search history.

(56) References Cited

U.S. PATENT DOCUMENTS 5,539,153 A * 7/1996 Schwiebert et al. ........ 174/260

5,861,323 A * 1/1999 Hayes ......................... 438/111  
2004/0110366 A1 * 6/2004 MacKay et al. ............. 438/613

FOREIGN PATENT DOCUMENTS

JP 11-008272 1/1999  
JP 2003-258012 9/2003

* cited by examiner

*Primary Examiner*—Dung A. Le  
(74) *Attorney, Agent, or Firm*—Cohen Pontani Lieberman & Pavane LLP

(57) ABSTRACT

A method of making a semiconductor device by forming bumps on pads of a test piece. The method includes a fastening process of pouring a bump material including a liquid and a plurality of individual pump materials toward a target face of a mask substrate, the mask substrate having a plurality of holding holes, and making bump materials to become fastened to the holding holes; a removing process of removing the individual bump materials remaining on the target face from the target face; and a compression process of compressing the pads of the test piece from the side of the target face of the mask substrate toward the mask substrate so as to bond the individual bump materials onto the pads. By this method, micro bump materials can be accurately attached onto pads on a silicon wafer, or the like, and the size of the mask substrate can be easily increased.

6 Claims, 4 Drawing Sheets

METHOD OF MAKING A SEMICONDUCTOR DEVICE USING BUMP MATERIAL INCLUDING A LIQUID

BACKGROUND OF THE INVENTION

1. Field of the Invention

The present invention relates to a bump forming method and system, and in particular, relates to a system for forming bumps on a semiconductor wafer such as a silicon wafer or a semiconductor chip such as a silicon chip, with high positional accuracy.

Priority is claimed on Japanese Patent Application No. 2004-126872, filed Apr. 22, 2004, the content of which is incorporated herein by reference.

2. Description of the Related Art

In conventional semiconductor devices such as ICs, LSIs, and VLSIs, bumps are formed at specific positions (typically, on pads) on a silicon wafer by printing, ball-bump forming, plating, transfer, wire-bonding, or the like. For example, in transfer, an attracting plate is used for attracting solder or gold balls, and the attracted balls are compressed onto pads on a silicon wafer, so as to form bumps on the pad (see Japanese Unexamined Patent Application, First Publication No. 2003-258012).

FIG. 8 is a diagram showing a concrete example of a bump forming method using a conventional attracting method. In FIG. 8, reference numeral 21 indicates a silicon wafer, reference numeral 22 indicates a stage on which the silicon wafer 21 is placed; reference numeral 23 indicates a chuck (i.e., a fastening device) for fastening the silicon wafer 21 onto the stage 22, reference numeral 24 indicates gold balls (i.e., bump materials), reference numeral 25 indicates an attracting and compressing plate (i.e., an attracting and compressing device) for performing vacuum attraction and ultrasonic compression of the gold balls 24, and reference numeral 26 indicates a finishing plate for pressing the gold balls 24 so as to provide a specific shape to each ball.

The structure of the attracting and compressing plate 25 will be explained with reference to FIG. 9. As shown in the figure, a panel plate 31 has a flat plane 31a (which is a major plane) on which concave portions 32, each having an approximately hemispherical shape, for attracting and holding the gold balls 24 are formed, where the positions of the concave portions 32 respectively correspond to the positions of the pads formed on the silicon wafer 21. A passage 33, an end of which is connected to each concave portion 32, is formed through the plate 31, where the other end of passage is connected to a vacuum pump or the like, which is used in vacuum attraction of the gold balls 24.

When forming gold balls 24 on the pads on the silicon wafer 21, first, the attracting and compressing plate 25 is brought close to the gold balls 24, and the inside of each concave portion 32 is decompressed via the passage 33 by using a vacuum pump or the like, so that each gold ball 24 is attracted into the concave portion 32. In the next step, the attracting and compressing plate 25 is moved above the silicon wafer 21 so that the plate 31 is brought close to the silicon wafer 21. As a result, each gold ball 24, which has been attracted to the concave portion of the attracting and compressing plate 25, is placed onto the silicon wafer 21. In the following step, ultrasonic waves having a specific frequency are applied to the plate 31 so as to vibrate each gold ball 24 and directly compress and bond the gold ball onto the aluminum pad, thereby producing a bump.

Recently, the pitch between pads on a semiconductor device is made shorter, that is, recent devices have fine pitches, so that micro balls to be attracted onto such pads are required. However, in a conventional bump forming method by attraction, the attraction process may repeatedly fail, thereby degrading the yield rate. More specifically, two or three balls 24 may be attracted into a single concave portion 32, or some balls 24 may fall from the concave portions 32; therefore, the success rate of transfer of balls 24 may be reduced and the yield rate of products may also be reduced.

In addition, micro balls 24 tend to fly in air flow, like powder, and also tend to attach to each other by static electricity; thus, it is very difficult to handle them.

SUMMARY OF THE INVENTION

In consideration of the above circumstances, an object of the present invention is to provide a bump forming method and system for accurately attaching micro bump materials onto pads on a silicon wafer, or the like.

Therefore, the present invention provides a bump forming method for forming bumps on pads of a test piece which is a semiconductor wafer or chip, comprising:

a fastening process of pouring a bump material including liquid toward a target face of a mask substrate in which a plurality of holding holes are provided, and making bump materials, included in the bump material including liquid, be fastened to the holding holes;

a removing process of removing bump materials remaining on the target face of the mask substrate; and a compression process of compressing the pads of the test piece from the side of the target face of the mask substrate toward the mask substrate so as to bond the bump materials onto the pads.

Typically, the shape of each bump material is a ball and the thickness of the mask substrate is smaller than the diameter of the ball.

Preferably, in the fastening process, a compressing plate is brought close to the side of the other face of the mask substrate, so as to produce capillary action between the mask substrate and the compressing plate, thereby discharging the bump material including liquid from the holding holes.

In the compressing process, the compressing plate may be pressed onto the other face of the mask substrate, so as to compress and bond the bump materials to the pads.

In the removing process, a cleaning liquid or gas may be supplied to the target face of the mask substrate so as to remove the bump materials.

In the fastening process, the mask substrate may be vibrated in a direction perpendicular to the thickness direction of the mask substrate, so as to fasten the bump materials to vacant holding holes.

The present invention also provides a bump forming system for forming bumps on pads of a test piece which is a semiconductor wafer or chip, comprising:

a mask substrate having holding holes;

a supply portion for supplying a bump material including liquid to a target face of the mask substrate;

a compressing plate, provided at the side of the other face of the mask substrate, which can optionally be made to contact with the other face; and a cleaning station for supplying a cleaning liquid or gas to the target face of the mask substrate, wherein after bump materials included in the bump material including liquid are fastened to the holding holes and the target face is cleaned, the bump materials are pressed, together with the mask substrate, onto the pads of the test piece.

Typically, the shape of each bump material is a ball and the thickness of the mask substrate is smaller than the diameter of the ball.

The bump forming system may further comprises a vibrating device for vibrating the mask substrate in a direction perpendicular to the thickness direction of the mask substrate, so as to fasten the bump materials to vacant holding holes.

According to the present invention, the bump material including liquid which contains bump materials is poured toward the mask substrate; thus, bump materials do not attach to each other by static electricity. Therefore, a single bump material can be fastened by a single holding hole.

In addition, when the bump materials are fastened to the holding holes, the dispersion medium of the bump material including liquid flows and is discharged from the holding holes. Therefore, it is possible to reliably fasten the bump materials to the holding holes along the flow of the dispersion medium.

Additionally, after the bump material fastening step, the bump materials remaining on the mask substrate are removed, thereby preventing adhesion of bump materials to an area other than the pads of the test piece.

Furthermore, the bump materials are compressed onto the pads of the test piece by using the compressing plate; thus, the bump materials can be reliably fastened to the pads.

According to the above method and system, micro bump materials can be accurately attached onto pads on a silicon wafer, or the like. In addition, the size of the mask substrate can be easily increased, and it is possible to simultaneously form a large number of bump materials, that is, a large number of bump electrodes on a semiconductor device.

DETAILED DESCRIPTION OF THE INVENTION

Hereinafter, embodiments according to the present invention will be explained with reference to the drawings.

Figure 1:
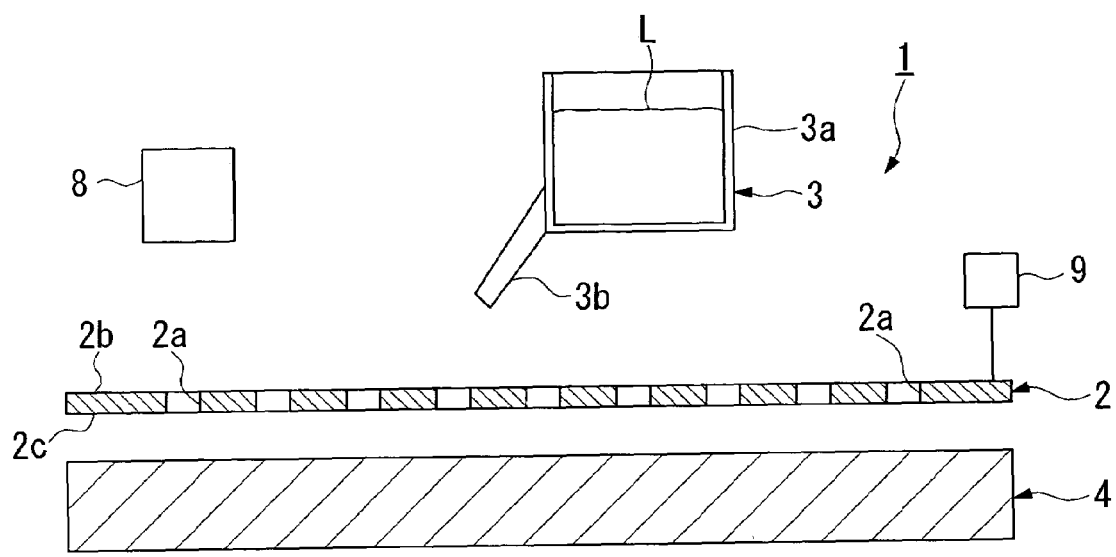
FIG. 1 is a diagram showing the general structure of an embodiment of the bump forming system of the present invention.

FIG. 1 is a diagram showing the general structure of an embodiment of the bump forming system of the present invention, which is a figure for explaining the structure of the bump forming system, and the size, thickness, dimension, and the like, of the explained system do not necessarily coincide with those of actual bump forming systems.

The bump forming system in FIG. 1 generally includes a mask substrate 2 having holding holes 2a, a supply portion 3 for supplying liquid L, which includes bump materials (i.e., the bump material including liquid L), onto a face 2b of the mask substrate 2, a compressing plate 4 provided at the other face 2c of the mask substrate 2 in a manner such that the plate 4 can optionally make contact with the other face 2c, and a cleaning station 8 for supplying a cleaning liquid or gas toward the face 2b of the mask substrate 2.

The supply portion 3 includes a tank 3a which contains the bump material including liquid L including bump materials, and a supply nozzle 3b provided at the tank 3a. In the bump material including liquid L contained in the tank 3a, the bump materials are dispersed in a dispersion medium. Specifically, the bump materials are micro ball particles made of a conductive material such as gold or gold alloy. Preferably, the average diameter of the particles of the bump materials is 10 μm to 100 μm. Here, required granularity is not constant owing to usage or purpose of the system; thus, the above preferable range is not always effective. However, in consideration of the strength of the mask substrate 2, the diameter is preferably 20 μm or greater.

The dispersion medium is water or alcohol having high purity. In particular, in order to prevent attraction between bump materials or adhesion of bump materials to other portions of the system due to static electricity, water including carbonic acid gas or the like is preferable. Accordingly, the electric resistance of the dispersion medium is lowered, thereby preventing occurrence of static electricity. In addition, cleaning liquid such as an organic solvent may also be included (in water or the like) so as to prevent adhesion of dirty bumps.

In the case of using alcohol as the main component of the dispersion medium, capability of removing static electricity and cleaning ability are high. However, in this case, an explosion proof system must be designed. Therefore, the above-described liquid having water as the main component is preferable because the system can be more easily managed. Preferably, the percentage content of the bump materials in the bump material containing liquid is approximately 10 to 15 percent by mass with respect to the dispersion medium.

The mask substrate 2 has holding holes 2a, each having a circular shape in plan view. Preferably, the holding holes 2a have a diameter 10 to 40% greater than that of the diameter of the bump materials, so that the bump materials are smoothly fastened to the holding holes 2a. When slightly chamfering each edge (in the face 2b) of the holding holes 2a, the bump materials can be smoothly fastened into the holes. In consideration of deformation of the bump materials in compression and transfer, the thickness of the mask substrate 2 is preferably one-fifth to four-fifth as long as the diameter of the bump material. Here, the above numerical ranges are reference values, and it is preferred to determine values in consideration of the accuracy of the actual system.

In addition, a vibrating device 9 is provided at the mask substrate 2 so that the mask substrate 2 is vibrated in a direction perpendicular to the thickness direction of the mask substrate 2.

A lifting device (not shown) is provided at the compressing plate 4, where the device can freely ascend and descend with respect to the mask substrate 2. The compressing plate 4 is formed using a flat metal plate or glass plate. The compressing plate 4 is also used as a pressing plate in transfer and compression of the bump materials onto pads of a test piece. A heater (not shown) is also provided under the compressing plate 4.

The operation of the above-explained bump forming system 1 will be explained hereinbelow. Bump formation using the bump forming system 1 is generally performed through a fastening process, a removing process, and a compression process.

Figure 2:
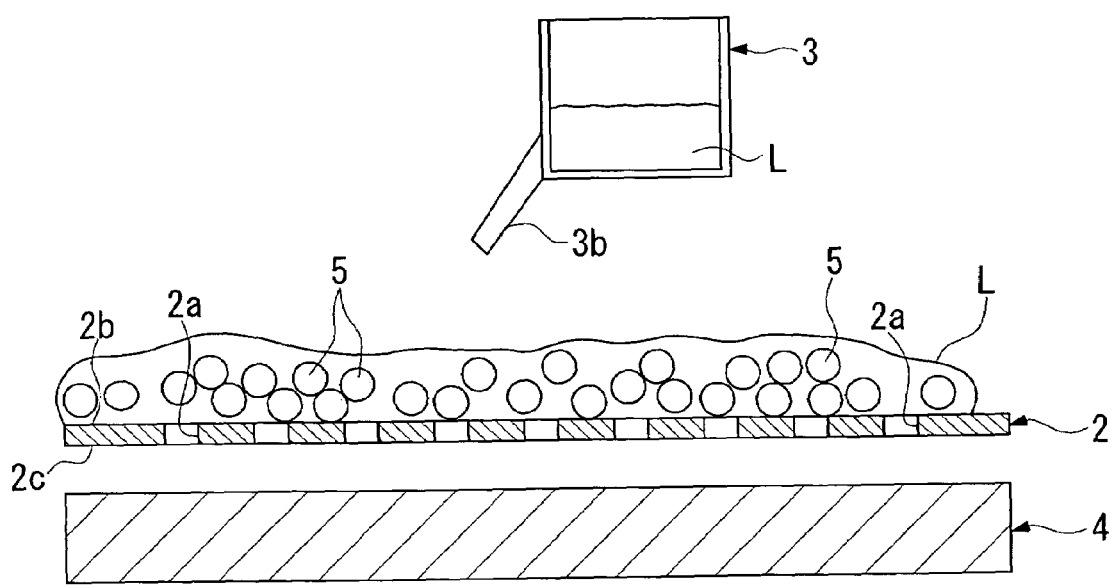
FIG. 2 is a diagram for explaining a process of the bump forming method using the bump forming system in the embodiment.

In the fastening process (see FIG. 2), the bump material including liquid L is sprinkled onto the face 2b of the mask substrate 2 from the supply nozzle 3b of the supply portion 3. Accordingly, the upper face of the mask substrate 2 is filled with the bump material including liquid L; therefore, a part of the bump materials 5 included or dispersed in the bump material including liquid L falls into the holding holes 2a of the mask substrate 2, which hold the part of the bump materials 5, and the other portion of the bump materials 5 remains on the mask substrate 2 together with the dispersion medium. In this state, the entire portion of the mask substrate 2 is vibrated using the vibrating device 9 (refer to FIG. 3), the bump materials 5 on the mask substrate 2 are again made to float, and the bump materials 5 are inserted and fastened into vacant holding holes 2a.

Figure 3:
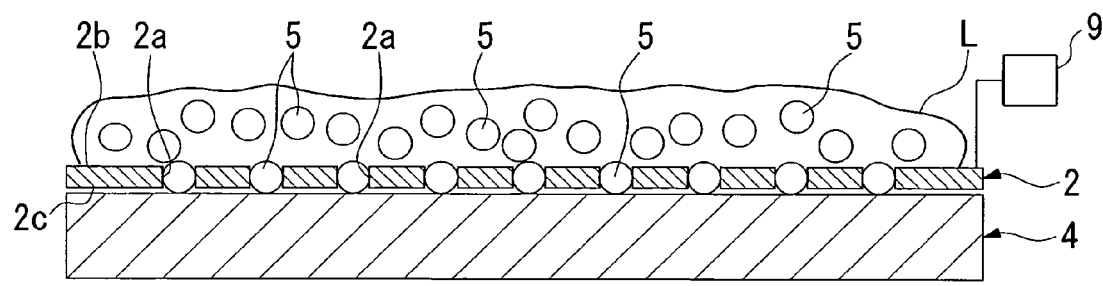
FIG. 3 is also a diagram for explaining a process of the bump forming method using the bump forming system in the embodiment.

As shown in FIG. 3, before or simultaneously with vibration of the mask substrate 2, the compressing plate 4 is brought close to the other face 2c of the mask substrate 2. Accordingly, capillary action occurs between the other face 2c and the compressing plate 4, so that the dispersion medium of the bump material including liquid L is discharged, through the holding holes 2, between the other face 2c and the compressing plate 4. The bump materials 5 are also made to flow along with the flow of the dispersion medium and are fastened into vacant holding holes 2a in turn. Here, only a small amount of dispersion medium flows from occupied holding holes 2a (i.e., holding the bump materials 5), and the dispersion medium continuously flows into vacant holding holes 2a (i.e., in which no bump materials are inserted) and thus the bump materials 5 are fastened in turn. Accordingly, all holding holes 2a are filled with the bump materials 5. Whether all holding holes 2a of the mask substrate 2 are filled with the bump materials 5 can be confirmed, for example, by using a camera provided at the bump forming system 1.

Figure 4:
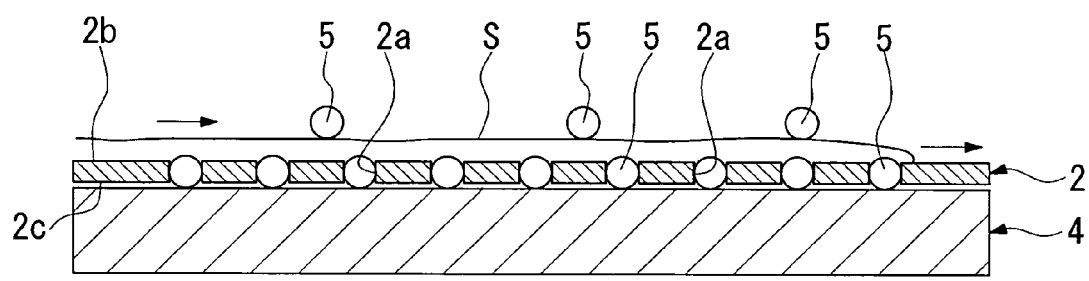
FIG. 4 is also a diagram for explaining a process of the bump forming method using the bump forming system in the embodiment.
Figure 5:
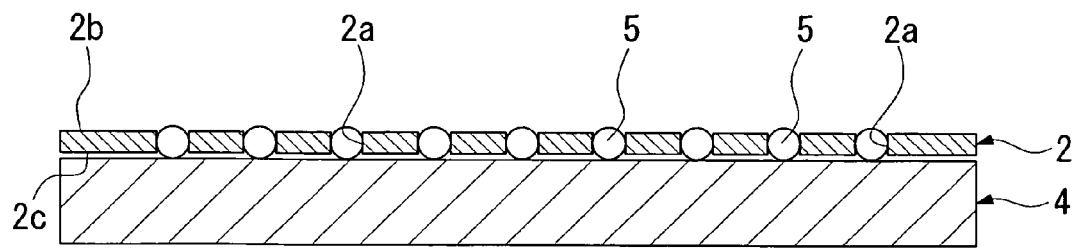
FIG. 5 is also a diagram for explaining a process of the bump forming method using the bump forming system in the embodiment.

In the next removing process, as shown in FIG. 4, cleaning liquid S such as water is poured toward the face 2b of the mask substrate 2, so as to wash away and remove the bump materials 5 remaining on the face 2b. For easy cleaning, the mask substrate 2 is slightly vibrated so as to float the excess bump materials 5 again, thereby increasing the efficiency of the removing process. In the next step, as shown in FIG. 5, the compressing plate 4 is heated using a heating device (not shown) so that the cleaning liquid S is evaporated. In this heating step, heat of a temperature sufficient for evaporating the cleaning liquid S (e.g., approximately 100° C. in case of water) is applied from the bottom side of the compressing plate 4 by using a heater. In addition, rays such as infrared rays, or a warm current of air may be applied from the upper side of the mask substrate 2.

Figure 6:
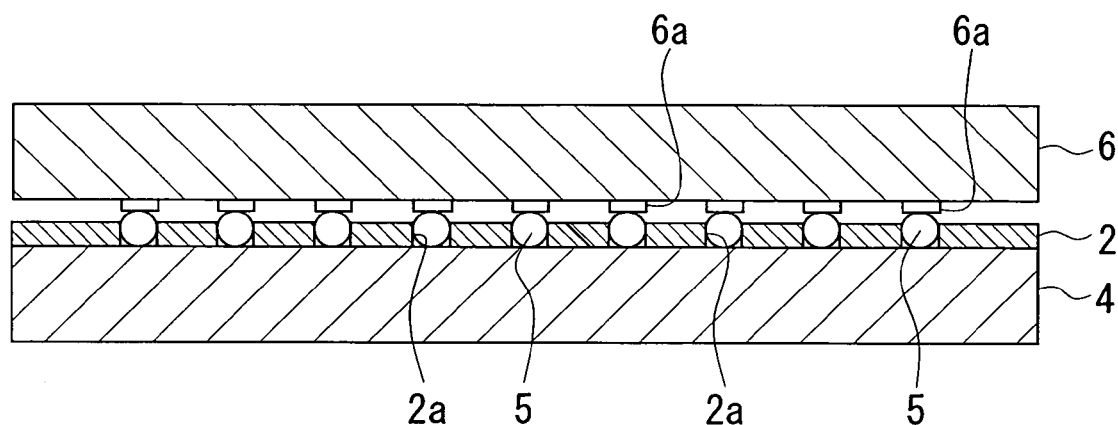
FIG. 6 is also a diagram for explaining a process of the bump forming method using the bump forming system in the embodiment.

In the next compression process, as shown in FIG. 6, a silicon wafer 6 such as a semiconductor wafer (i.e., a test piece) is compressed onto the face 2b of the mask substrate 2. On the lower surface of the silicon wafer 6, pads 6a are provided, which are each compressed onto each bump material 5. In this process, the other face 2c of the mask substrate 2 is made to completely contact with the compressing plate 4. Accordingly, the bump materials 5 contact the compressing plate 4 and are pushed up, so that the relative position of the mask substrate 2 with respect to the bump materials 5 is shifted toward the compressing plate 4. Therefore, interference between the silicon wafer 6 and the mask substrate 2 is prevented.

Also in the compression process, the compressing plate 4 or the mask substrate 2, or both of them are vibrated using an ultrasonic vibration system, so as to compress the pads 6a to the bump materials 5. When the bump materials 5 are made of gold or gold alloy and the pads 6a of the silicon wafer 6 are made of metal such as aluminum, copper, gold, or the like, an alloy layer is produced between the pads 6a and the bump materials 5, thereby realizing strong contact. In addition, instead of ultrasonic vibration, heat is applied to perform compressive contact.

Figure 7:
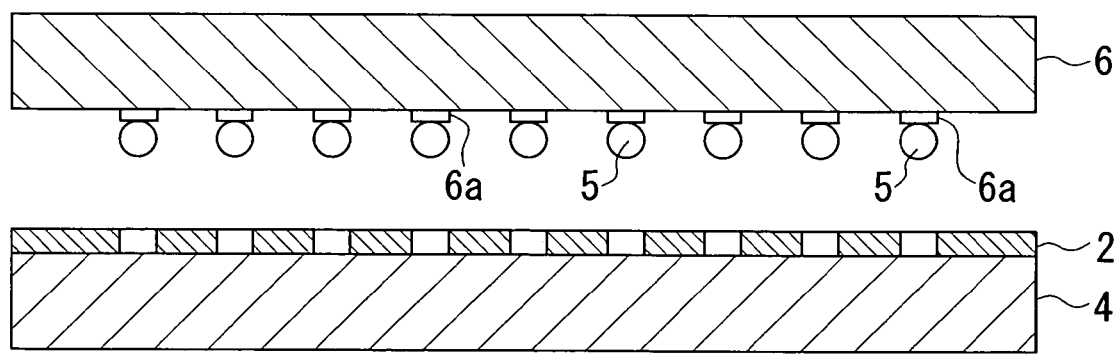
FIG. 7 is also a diagram for explaining a process of the bump forming method using the bump forming system in the embodiment.
Figure 8:
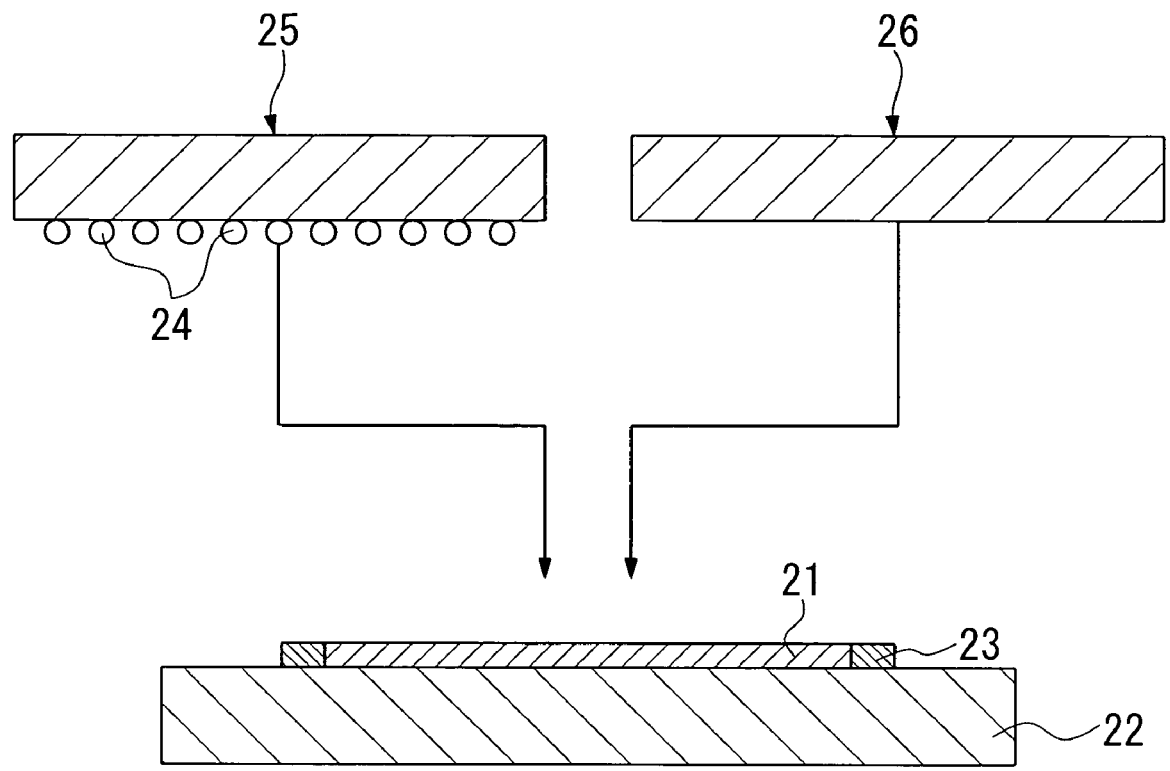
FIG. 8 is a diagram for explaining a conventional bump forming method.
Figure 9:
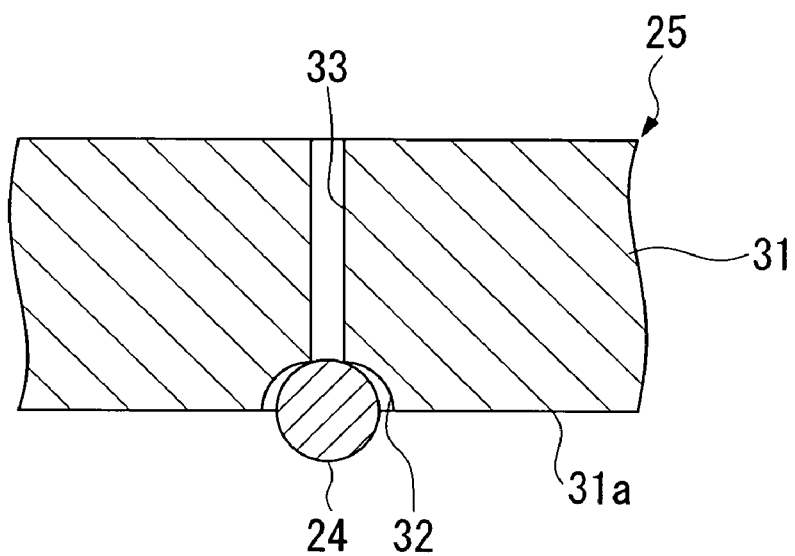
FIG. 9 is also a diagram for explaining a conventional bump forming method.

After compression, as shown in FIG. 7, (i) the compressing plate 4 and the mask substrate 2, and (ii) the silicon wafer 6 are separated from each other by moving these portions in the vertical direction. After that, inspection using a camera is performed for determining whether the bump materials 5, transferred onto the silicon wafer 6, were transferred to the accurate positions. If an unsatisfactory result is obtained, remounting of a bump material to a target position is performed. Such handling for a single bump material can be performed, for example, by a conventional adhesion method.

According to the above-explained processes, all or a part of the bump materials 5 can be simultaneously, efficiently, and correctly transferred onto the silicon wafer 6. Owing to such simultaneous transfer, the time necessary for forming bumps can be shorter in comparison with the other methods, so that the costs for forming bumps can also be reduced. Therefore, the present method is effective in view of costs and productivity.

In addition, according to the present invention, the bump materials 5 can be efficiently and correctly arranged on the mask substrate 2 and can also be transferred onto correct positions. Furthermore, the size of the mask substrate 2 can be fit with that of the silicon wafer 6; thus, the present system can be applied to wafers having any size.

The present invention is a system of directly forming bumps on pads of a semiconductor wafer (such as a silicon wafer); thus, bump formation can be performed after tests (or inspections) of the semiconductor wafer, Therefore, conventional test methods can also be used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in order to realize smooth flow of discharged dispersion medium of the bump material including liquid L, (i) grooves may be provided in the surface of the compressing plate 4 or the other face 2c, (ii) holes may be provided in areas other than the areas where the holding holes 2a are provided in the mask substrate 2, so as to absorb the dispersion medium from the bottom (or lower) side, or (iii) protrusions of a height of approximately 5 μm may be provided on the other face 2c of the mask substrate 2, that is, between the other face 2c and the compressing plate 4, so as to discharge the dispersion medium. The above methods should be performed in consideration of vicinity of the dispersion medium, and it is unnecessary to adopt all of the methods.

The positional relationship between the mask substrate 2 and compressing plate 4 may be upside down.

Additionally, gold balls are generally used in the above explanations; however, other conductive balls (made of pure metal or alloy of aluminum, solder, silver, and the like) may be used.

What is claimed is:

1. A method of making a semiconductor device by forming bumps on pads of a test piece which is a semiconductor wafer or chip, comprising:
   a fastening process of pouring a bump material including a liquid and a plurality of individual bump materials toward a target face of a mask substrate in which a plurality of holding holes are provided, and making at least some of the individual bump materials to become fastened to the holding holes;
   a removing process of removing those of the individual bump materials remaining on the target face of the mask substrate that have not become fastened to the holding holes; and
   a compression process of compressing the pads of the test piece from the side of the target face of the mask substrate toward the mask substrate so as to bond the individual bump materials that became fastened to the holding holes onto the pads.

2. The method as claimed in claim 1, wherein the shape of each of said individual bump materials is a ball and the thickness of the mask substrate is smaller than the diameter of the ball.

3. The method as claimed in claim 1, wherein in the fastening process, a compressing plate is brought close to the side of the other face of the mask substrate, so as to produce capillary action between the mask substrate and the compressing plate, thereby discharging the liquid of the bump material from the holding holes.

4. The method as claimed in claim 1, wherein in the compressing process, the compressing plate is pressed onto the other face of the mask substrate, so as to compress and bond the individual bump materials to the pads.

5. The method as claimed in claim 1, wherein in the removing process, a cleaning liquid or gas is supplied to the target face of the mask substrate so as to remove the individual bump materials remaining on the target face of the mask substrate from the target face of the mask substrate.

6. The method as claimed in claim 1, wherein in the fastening process, the mask substrate is vibrated in a direction perpendicular to the thickness direction of the mask substrate, so as to fasten the individual bump materials to vacant holding holes.

* * * * *